United States Patent [19]

Nishiyama et al.

[11] 4,433,264
[45] Feb. 21, 1984

[54] ELECTRODE STRUCTURE FOR A ZINC OXIDE THIN FILM

[75] Inventors: Hiroshi Nishiyama; Takeshi Nakamura, both of Kyoto, Japan

[73] Assignee: Murata Manufacturing Co., Ltd., Nagaokakyo, Japan

[21] Appl. No.: 500,828

[22] Filed: Jun. 3, 1983

[30] Foreign Application Priority Data

Jun. 30, 1982 [JP] Japan ................................. 57-114445

[51] Int. Cl.³ .......................................... H01L 41/08
[52] U.S. Cl. .................................. 310/321; 310/363; 310/364
[58] Field of Search ............... 310/321, 322, 324, 363, 310/364, 360

[56] References Cited

U.S. PATENT DOCUMENTS

| | | | |
|---|---|---|---|
| 3,846,649 | 11/1974 | Lemann et al. | 310/360 X |
| 3,984,790 | 10/1976 | Tanaka | 310/321 X |
| 4,037,121 | 7/1977 | Nakamura et al. | 310/321 |
| 4,178,526 | 12/1979 | Nakamura et al. | 310/321 |
| 4,302,694 | 11/1981 | Fujishima et al. | 310/321 |

*Primary Examiner*—Mark O. Budd
*Attorney, Agent, or Firm*—Finnegan, Henderson, Farabow, Garrett & Dunner

[57] ABSTRACT

An electrode structure for a zinc oxide thin film having a $SnO_2$ layer between the surface of the zinc oxide thin film and the electrode. A tuning fork vibrator equipped with such a structure has a high reliability in that changes in resonance frequency and insulation resistance (IR) with time are small and the increase in series resonance resistance ($R_O$) is small.

7 Claims, 12 Drawing Figures

ELECTRODE STRUCTURE FOR A ZINC OXIDE THIN FILM

FIELD OF THE INVENTION

The present invention relates to an electrode structure for a zinc oxide thin film having stable electrical characteristics.

BACKGROUND OF THE INVENTION

Zinc oxide thin films are well known for use as a piezoelectric material for such devices as a surface acoustic wave device, a tuning fork vibrator or a tuning bar vibrator.

In FIG. 1 there is shown an example of a conventional zinc oxide thin film tuning fork vibrator which includes a main body 1 having leg portions 2 and 3. Zinc oxide thin films 4 and 5 are formed on the respective side walls 2a and 3a of leg portions 2 and 3 and Cr-Au or Ti-Au base electrodes 6 and 7 are formed, respectively, on top of the zinc oxide thin films 4 and 5. Zinc oxide thin films 4 and 5 can be formed by a chemical vapor deposition or a physical vapor deposition process such as vacuum deposition, sputtering, or ion plating.

More specifically, Cr-Au or Ti-Au base electrodes 6 and 7 have the structure shown in FIG. 2 and comprise an inner electrode layer 8 of Cr or Ti and an outer electrode layer 9 made of Au. Cr or Ti are used for their adhesion properties and Au is used for its wire bonding or soldering characteristics. An example of a ZnO thin film tuning fork resonator having a gold electrode is described in "Tuning Fork Resonators for Electronic Wrist Watches Using ZnO Sputtered Film", S. Fujishima et al., Proceedings of the First Meeting on Ferroelectric Materials and their Applications, Kyoto, Japan (1977), pp. 49-52. Cr-Au base electrodes include, as well as a Cr-Au electrode, a Cr-Pt-Au electrode, a Cr-Pd-Au electrode, a Cr-Ni-Au electrode, a Cr-Cu-Ni-Au electrode, and a Cr-Cu-Au electrode. Similarly, Ti-Au base electrodes include, as well as a Ti-Au electrode, a Ti-Cu-Au electrode, a Ti-Pt-Au electrode, and a Ti-Pd-Au electrode. In the case of a Ti-Au base or Cr-Au base electrode, the Ti or Cr layer had a film thickness ranging between 200 Å and 500 Å and the Au layer has a film thickness ranging between 3,000 Å and 5,000 Å. They can be formed by techniques such as resistance heating deposition, electron beam heating deposition or ion plating.

These electrodes for zinc oxide thin film, however, have the following defects. Since Ti or Cr in the first electrode layer has a high affinity, the Ti or Cr diffuses into the zinc oxide film or receives oxygen form the zinc oxide which deteriorates the electrical characteristics of the zinc oxide thin film and can seriously change its resonance frequency. This phenomenon is accelerated when the electrode is subjected to a high temperature life test, resulting in a further deterioration in the electrical characteristics of the zinc oxide thin film.

An Al electrode structure for a zinc oxide thin film is also known. It has been used because it is inexpensive and can be easily bonded. The Al electrode, however, also has a high affinity, diffusing into the zinc oxide thin film and causing a deterioration in the film's electrical characteristics. The diffusion of 3-valent Al in zinc oxide, a 2-valent semiconductor, deteriorates the electrical characteristics of the zinc oxide thin film and seriously changes its resonance frequency. When the Al electrode is subjected to a high temperature life test, the change is accelerated and the deterioration of the electrical characteristics is further increased as compared with the Ti-Au base or Cr-Au base electrodes.

It has therefore been desirable to develop an improved electrode structure for zinc oxide thin films.

SUMMARY OF THE INVENTION

Accordingly, an object of the present invention is to provide an electrode structure for a zinc oxide thin film, exhibiting stable electrical characteristics.

The object of the present invention can be obtained by providing in the electrode structure for a zinc oxide thin film a $SnO_2$ layer between the surface of the zinc oxide thin film and the electrode.

DETAILED DESCRIPTION OF THE INVENTION

It is to be understood that both the foregoing general description and the following detailed description are exemplary and explanatory but are not restrictive of the invention. The present invention will be explained in detail by reference to the accompanying drawings.

Figure 1:
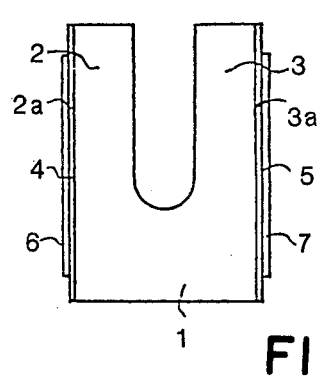
FIG. 1 is a side view of a prior art tuning fork vibrator.
Figure 2:
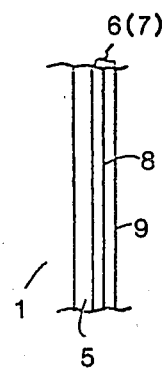
FIG. 2 is an enlarged fragmentary view of the electrode structure of the vibrator of FIG. 1.
Figure 3:
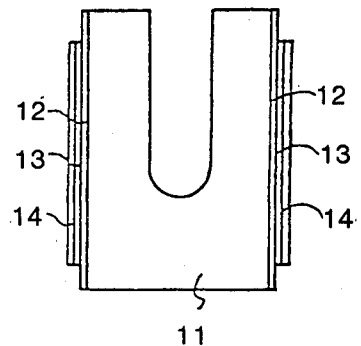
FIG. 3 is a side view of a zinc oxide thin film tuning fork vibrator havin an electrode structure of the present invention.

FIG. 3 is a side view of a tuning fork vibrator equipped with an electrode structure of the present invention. This tuning fork vibrator comprises a metal tuning fork 11 having a zinc oxide thin film 12, a $SnO_2$ layer 13, and an electrode 14 on both legs of the fork. The fork may be made of Elinvar, which consists of 42 wt% of Ni, 5.4 wt% of Cr, 2.4 wt% of Ti, 0.001 wt% of C, 0.5 wt% of Mn, 0.6 wt% of Si, 0.6 wt% of Al and the balance of Fe. Stannic oxide layer 13 can be formed by techniques such as an electron beam heating deposition process, a sputtering process, an ion beaming process, a resistance heating deposition process or an ion plating process. The thickness of the $SnO_2$ layer is suitably 100 Å to 100,000 Å; preferably 1,000 Å to 50,000 Å; and, more preferably, 3,000 Å to 10,000 Å. The $SnO_2$ layer may contain a small amount of Sb to control its resistance. A preferred amount of Sb is from 1 to 15 mol %.

Figure 4:
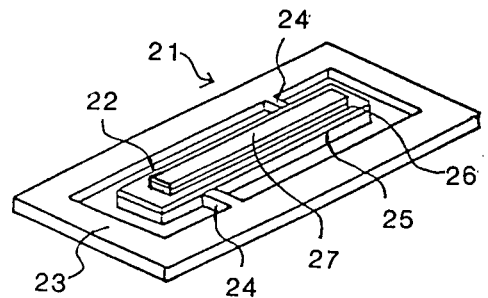
FIG. 4 is a perspective view of a tuning bar vibrator using the electrode structure of the present invention for the zinc oxide thin film.

FIG. 4 is a perspective view of a tuning bar vibrator of bending mode, provided with an electrode structure of the present invention. The main body of tuning bar vibrator 21 comprises basically a vibrator 22 and a frame 23 supporting vibrator 22 by supports 24. On the vibrator 22 are provided a zinc oxide thin film 25, a SnO$_2$ layer 26, and an electrode 27 in that order.

Figure 5:
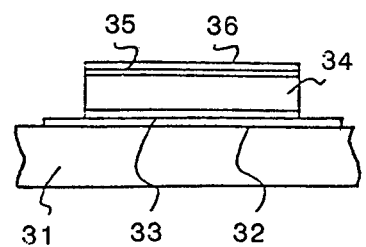
FIGS. 5 to 7 are each a side view of a vibrator equipped with the electrode structure of the present invention for the zinc oxide thin film.

FIG. 5 is a side view of another vibrator of bending mode also equipped with an electrode structure of the present invention. This vibrator comprises a substrate 31 made, for example, of ceramics, plastics, or rubber. An electrode 32, a SnO$_2$ layer 33, a zinc oxide thin film layer 34, a SnO$_2$ layer 35, and an electrode 36, are all provided on the substrate 31 in that sequence.

Figure 6:
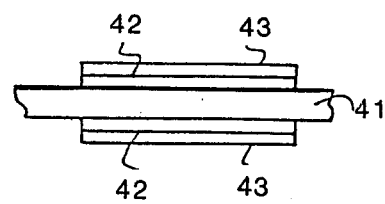

FIG. 6 is a side view of a vibrator of extension mode equipped with an electrode structure of the present invention. This vibrator comprises a zinc oxide thin film 41, and SnO$_2$ layers 42-42 and electrodes 43-43 formed on both sides of the zinc oxide thin film 41 in that sequence.

Figure 7:
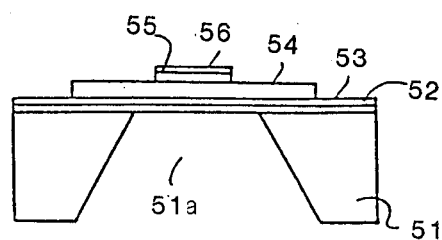

FIG. 7 is a side view of a vibrator of thickness mode equipped with an electrode structure of the present invention. This vibrator comprises a substrate 51 made of, e.g., Si, SiO or the like, and an electrode 52 and a SnO$_2$ layer 53 provided in that order on substrate 51. In addition, a zinc oxide thin film 54 is formed on SnO$_2$ layer 53. An empty space 51a is formed in the substrate 51 at a position corresponding to that where the zinc oxide thin film 54 has a SnO$_2$ layer 55 and an electrode 56 laminated on the zinc oxide thin film layer in that order.

A specific example of an electrode structure of the present invention will be explained with reference to FIG. 3. The zinc oxide thin films 12 were first formed on vibrator 11 by a sputtering process. A SnO$_2$ layer 13, containing from 3 to 7 mol% of Sb$_2$O$_3$, was then formed by a sputtering process on the zinc oxide thin films 12, each layer 13 having a thickness of 5,000 Å. Ti-Au base electrodes 14 (thickness of Ti layer, 300 Å; thickness of Au layer, 3,000 Å) were then formed on the SnO$_2$ layers 13 by an electron beam heating deposition process. In this way, a vibrator having a resonance frequency of 32 KHz was produced.

The vibrator was allowed to stand at a temperature of 100° C. for 10,000 hours while applying a D.C. voltage of 20 V. During this period, the life characteristic of resonance frequency was measured. This measurement was performed on 20 samples. For comparison, a vibrator was tested in the same manner that had the same structure as above except that an SnO$_2$ layer was not used.

Figure 8:
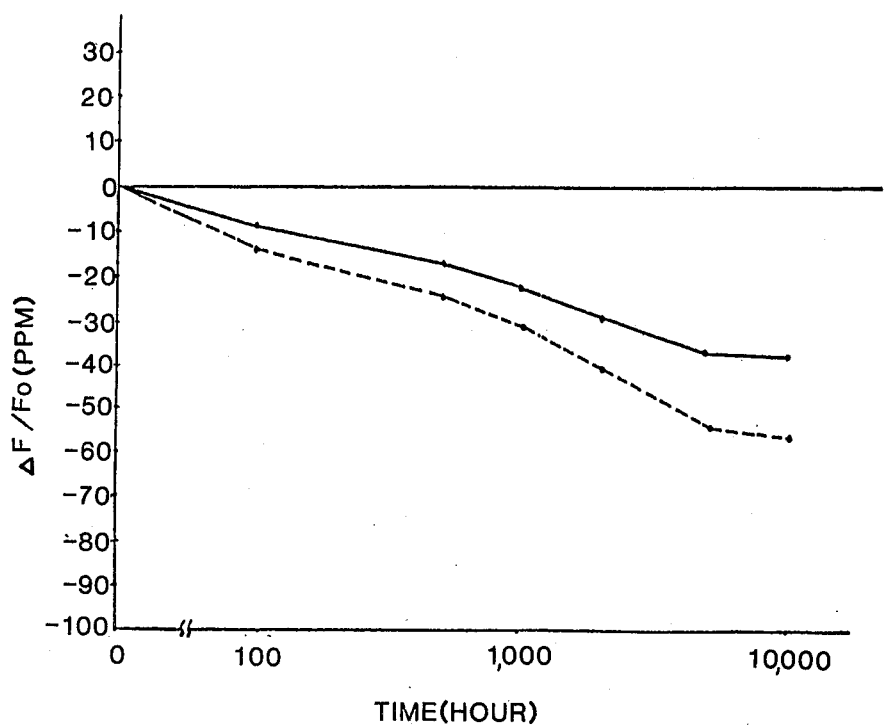
FIG. 8 is a graph showing resonance frequency vs. time.

The results are shown in FIG. 8; the value of life characteristic of resonance frequency ($\Delta F/F_0$) as defined below being plotted against time.

$$\Delta F/F_0 = \frac{\text{Resonance Frequency} - \text{Initial Resonance Frequency}}{\text{Initial Resonance Frequency}} \text{(ppm)}$$

Figure 9:
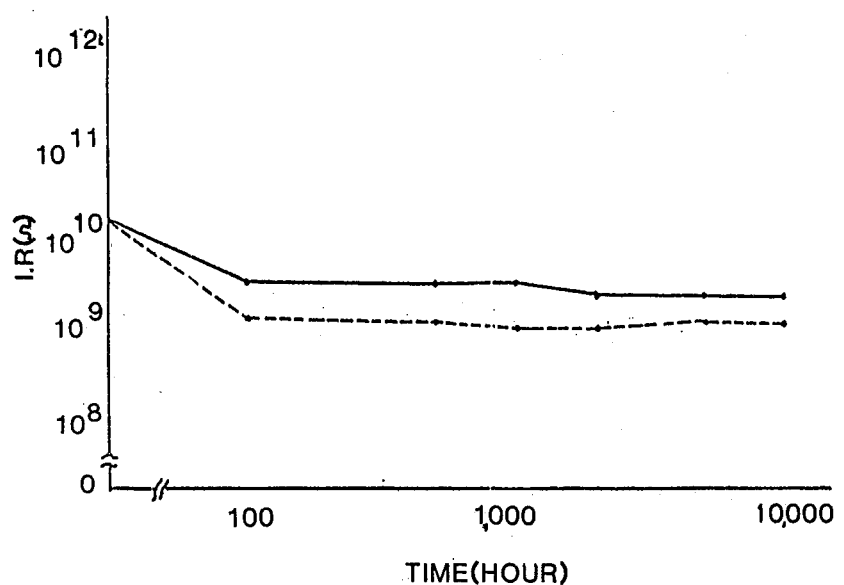
FIG. 9 is a graph showing IR vs. time.
Figure 10:
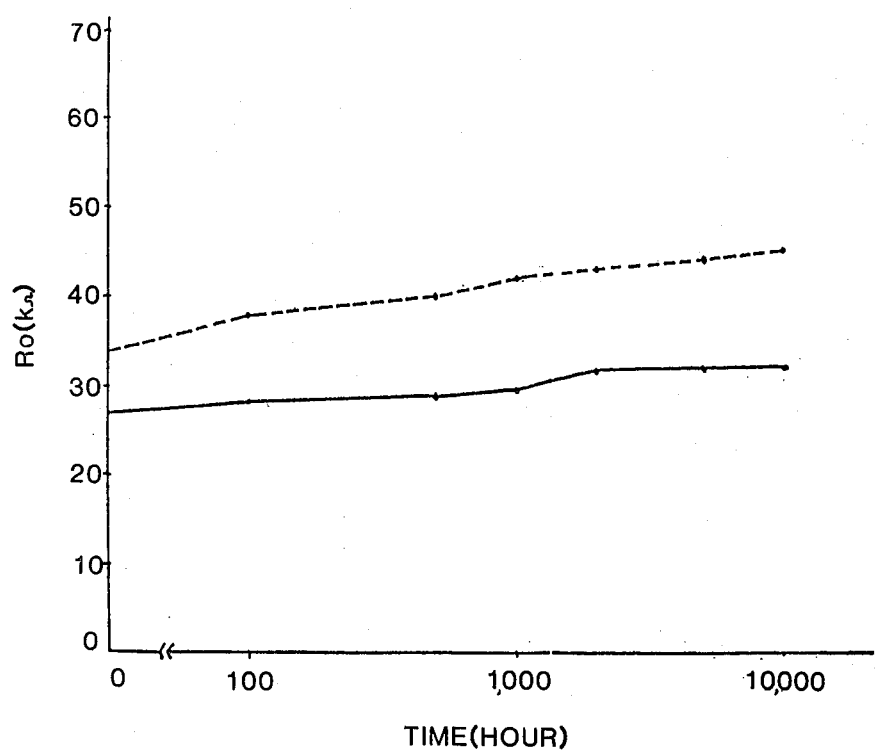
FIG. 10 is a graph showing $R_0$ vs. time.

Changes with time in insulation resistance (IR) and series resonance resistance (R$_0$) were also measured. The results are shown in FIGS. 9 and 10, respectively. IR was measured at a D.C. voltage of 10 V.

In FIGS. 8, 9 and 10 the samples constructed according to the present invention are indicated with a solid line and the comparative samples with a dotted line.

It can be seen from FIGS. 8 to 10 that with tuning fork vibrators having the electrode structure of the present invention, changes with time in resonance frequency and IR are small compared with those for conventional vibrators and R$_0$ is small compared with that of a conventional vibrator.

Figure 11:
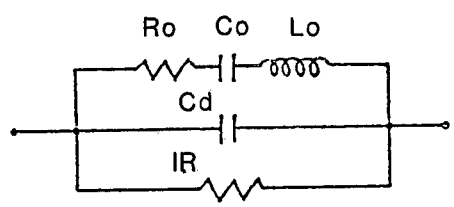
FIG. 11 is an equivalent circuit of a zinc oxide thin film.

IR and R$_0$ were measured for the following reasons. An equivalent circuit for the zinc oxide thin film is illustrated in FIG. 11 wherein Cd is a parallel capacity, which is a value similar to an electrostatic capacity when the zinc oxide thin film is a condenser, R$_0$ is a series resonance resistance, C$_0$ is an equivalent capacity, L$_0$ is an equivalent inductance, and IR is the insulation resistance of the zinc oxide thin film.

It is necessary for the value of IR of the zinc oxide thin film to be high so that it will possess the characteristics required for a piezoelectric material. Therefore, a reduction in IR is not desirable. With tuning fork vibrators having the electrode structure of the present invention, as is apparent from FIG. 9, the reduction in IR is small compared with those for conventional vibrators. This demonstrates that the electrode structure of the present invention is useful for zinc oxide thin films.

Figure 12:
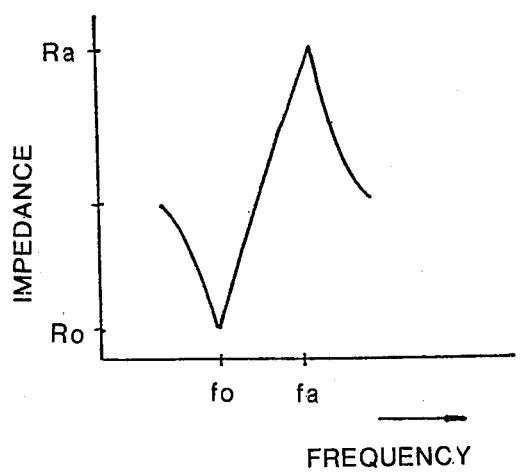
FIG. 12 is a graph showing the relation between impedance and frequency.

Tuning fork vibrators having the electrode structure of the present invention have a small R$_0$. From the relation between impedance and frequency as illustrated in FIG. 12, R$_0$ corresponds to a series resonance frequency (f$_0$). It is therefore understood that as the value of R$_0$ increases, the amplitude in oscillation circuit needs to be increased. Accordingly, it can be seen that with tuning fork vibrators having the electrode structure of the present invention, the foregoing problems do not arise, and the tuning fork vibrators are sufficiently usable even under high temperature conditions. It has been confirmed that the electrode structure of the present invention is applicable to Cr-Au base and Al electrodes with the same results.

In summary and in accordance with the present invention, an SnO$_2$ layer is provided between the zinc oxide thin film and the electrode. The presence of the SnO$_2$ layer provides the zinc oxide thin films with sufficient characteristics for practical use. In particular, there is obtained a zinc oxide thin film having a high reliability in that changes in resonance frequency and IR are small, and the value of R$_0$ is not increased.

The invention in its broader aspects is not limited to the specific details shown and described and departures may be made from such details without departing from the scope of the invention or sacrificing its chief advantages.

What is claimed is:

1. An electrode structure for a zinc oxide thin film comprising an electrode and a SnO$_2$ layer between the surface of the zinc oxide thin film and the electrode.

2. The electrode structure of claim 1, wherein the electrode is selected from the group consisting of Cr-Au or Ti-Au base electrodes.

3. The electrode structure of claim 2, wherein the Cr or Ti layer of the base electrode has a thickness of 200 Å to 500 Å and the Au layer a thickness of 3,000 Å to 5,000 Å.

4. The electrode structure of claim 3, wherein the SnO$_2$ layer has a thickness of 100 Å to 100,000 Å.

5. The electrode structure of claim 4, wherein the SnO$_2$ layer has a thickness of 3,000 Å to 10,000 Å.

6. The electrode structure of claim 1, including 1 to 15 mol% of Sb in the SnO$_2$ layer.

7. In a tuning fork vibrator having a zinc oxide thin film layer and an electrode, the improvement comprising a SnO$_2$ layer between the surface of the zinc oxide thin film and the electrode.

* * * * *